(12) United States Patent
Bader et al.

(10) Patent No.: US 7,129,528 B2
(45) Date of Patent: Oct. 31, 2006

(54) ELECTROMAGNETIC RADIATION EMITTING SEMICONDUCTOR CHIP AND PROCEDURE FOR ITS PRODUCTION

(75) Inventors: Stefan Bader, Eilsbrunn (DE); Dominik Eisert, Regensburg (DE); Berthold Hahn, Hemau (DE); Stephan Kaiser, Regensburg (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 10/671,854

(22) Filed: Sep. 25, 2003

(65) Prior Publication Data

US 2004/0113167 A1    Jun. 17, 2004

(30) Foreign Application Priority Data

Sep. 30, 2002   (DE) ............................... 102 45 628

(51) Int. Cl.
*H01L 33/00*   (2006.01)
(52) U.S. Cl. ................. 257/98; 257/103; 257/E33.068; 257/E33.072
(58) Field of Classification Search ............ 257/94–96, 257/98, 99, 103, E33.072, E33.068
See application file for complete search history.

(56) References Cited

U.S. PATENT DOCUMENTS

| | | | | |
|---|---|---|---|---|
| 5,814,839 | A * | 9/1998 | Hosoba ........................ | 257/96 |
| 6,342,404 | B1 * | 1/2002 | Shibata et al. ................. | 438/46 |
| 6,441,403 | B1 | 8/2002 | Chang et al. | |
| 6,531,719 | B1 * | 3/2003 | Shibata et al. ............... | 257/190 |

FOREIGN PATENT DOCUMENTS

| | | |
|---|---|---|
| DE | 2 030 974 | 1/1971 |
| DE | 100 00 088 A1 | 8/2000 |
| DE | 199 11 717 A1 | 9/2000 |
| DE | 199 43 406 A1 | 4/2001 |
| DE | 100 06 738 A1 | 9/2001 |
| DE | 100 20 464 A1 | 11/2001 |
| JP | 2001 168387 A | 6/2001 |

* cited by examiner

*Primary Examiner*—Minh-Loan Tran
(74) *Attorney, Agent, or Firm*—Cohen, Pontani, Lieberman & Pavane

(57) ABSTRACT

Semiconductor chip which emits electromagnetic radiation, and method for fabricating it. To improve the light yield of semiconductor chips which emit electromagnetic radiation, a textured reflection surface (131) is integrated on the p-side of a semiconductor chip. The semiconductor chip has an epitaxially produced semiconductor layer stack (1) based on GaN, which comprises an n-conducting semiconductor layer (11), a p-conducting semiconductor layer (13) and an electromagnetic radiation generating region (12) which is arranged between these two semiconductor layers (11, 13). The surface of the p-conducting semiconductor layer (13) which faces away from the radiation-generating region (12) is provided with three-dimensional pyramid-like structures (15). A mirror layer (40) is arranged over the whole of this textured surface. A textured reflection surface (131) is formed between the mirror layer (40) and the p-conducting semiconductor layer (13). The textured reflection surface (131) can increase the amount of light which is decoupled at the radiation-outcoupling surface (111) by virtue of the fact that a beam (3), after double reflection on the reflection surface (131), is more likely not to be totally reflected.

18 Claims, 6 Drawing Sheets

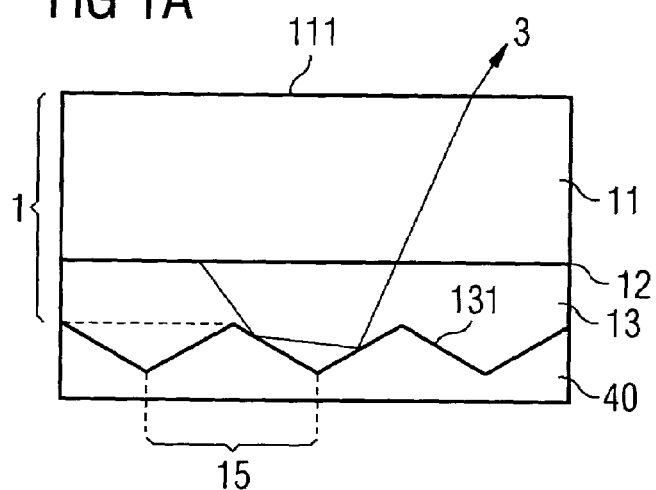
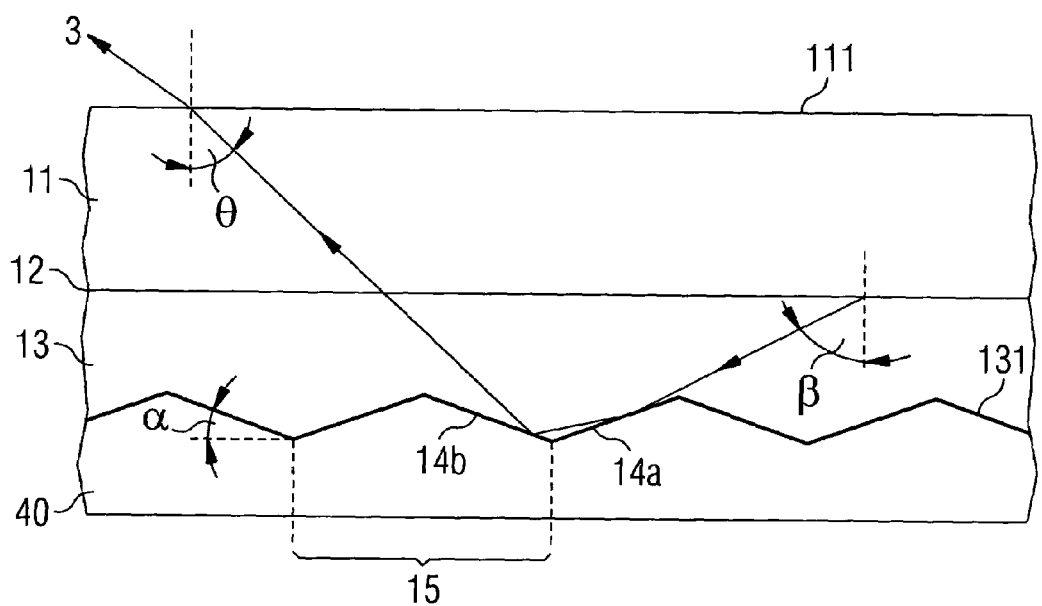

ELECTROMAGNETIC RADIATION EMITTING SEMICONDUCTOR CHIP AND PROCEDURE FOR ITS PRODUCTION

FIELD OF THE INVENTION

The invention relates to a semiconductor chip which emits electromagnetic radiation, having an epitaxially produced semiconductor layer stack based on nitride semiconductor material, which includes an n-conducting semiconductor layer, a p-conducting semiconductor layer and an electromagnetic radiation generating region which is arranged between these two semiconductor layers, a base on which the semiconductor layer stack is arranged, and a mirror layer, which is arranged between the semiconductor layer stack and the base, and a method for fabricating a plurality of these semiconductor chips which emit electromagnetic radiation.

BACKGROUND OF THE INVENTION

The term semiconductor layer stack based on nitride III–V compound semiconductor material is intended to encompass all semiconductor layer stacks whose main properties are determined by a nitride III–V compound semiconductor material. Nitride III–V compound semiconductor materials are all semiconductor materials which have nitrogen at the V lattice site, in particular GaN, InGaN, AlGaN and InGaAln. The semiconductor layer stack may, for example, have a conventional pn junction, a double heterostructure, a single quantum well structure (SQW structure) or a multiple quantum well structure (MQW structure). Structures of this type are known to the person skilled in the art and are therefore not explained in more detail at this point.

Semiconductor chips of the type described above convert electrical energy into electromagnetic radiation or vice versa. To do this, they usually have a semiconductor diode structure, which generates electromagnetic radiation in what is known as an active area beween a p-conducting semiconductor layer and an n-conducting semiconductor layer. One problem of chips of this type is the outcoupling of the maximum possible proportion of the radiation which is generated in the electromagnetic radiation generating region.

In the case of what is known as a thin-film LED chip (LED=light emitting diode), which generally comprises a radiation-generating semiconductor layer stack arranged on a base, the thin semiconductor layers are grown epitaxially on a growth substrate wafer, which is detached after the semiconductor layers have, for example, been rebounded onto a base.

A semiconductor chip of this type is known, for example, from DE 100 20 464 A1. In this case, a reflector is formed on a surface of a semiconductor layer stack which is located on the side of the semiconductor layer stack opposite to the surface from which light emerges out of the semiconductor layer stack. The reflector is formed by a dielectric mirror or by a reflective metallic contact surface, which at the same time is also used for establishing the electrical contact of the semiconductor body. To improve the outcoupling of light, the entire free surface of the semiconductor body is roughened in order to prevent total reflection at the outcoupling surface between the semiconductor body and the environment and to thereby increase the light yield of the semiconductor chip.

A drawback of this type of semiconductor chip is that the roughening of the outcoupling surface requires at least one additional method step, entailing additional time expenditure and therefore additional costs. Furthermore, the light yield of these semiconductor chips is still well short of the theoretical maximum.

Hitherto, the prior art has not disclosed any measures for improving the light yield of semiconductor chips of the type described above which are directed at the p-conducting semiconductor layer. A particular problem of p-conducting nitride III–V compound semiconductor layers is their sensitivity to chemical or mechanical treatment. Contacts with low contact resistances can only be produced with difficulty on surfaces which have been treated in this way. Therefore, surface patterning of the p-conducting semiconductor layer by etching or mechanical roughening is not advantageous.

Therefore, as an alternative the n-conducting semiconductor layer is generally textured by means of RIE (reactive ion etching). However, this method requires the n-conducting semiconductor layer to be detached from the growth substrate wafer. The side from which the growth substrate wafer has been removed must also first of all be planarized, so that the mask layers which are required for patterning can be applied. Further process steps are required in order to pattern the surface in a suitable etching installation and then to remove the mask layer.

SUMMARY OF THE INVENTION

An object of the invention is to provide a semiconductor chip of the type described above with an increased light yield and without great technical effort.

A further object of the present invention is to develop a method for fabricating semiconductor chips of this type.

This and other objects are attained in accordance with one aspect of the invention directed to a semiconductor chip which emits electromagnetic radiation, having an epitaxially produced semiconductor layer stack based on nitride semiconductor material, which includes an n-conducting semiconductor layer, a p-conducting semiconductor layer and an electromagnetic radiation generating region which is arranged between these two semiconductor layers, a base, on which the semiconductor layer stack is arranged, and a mirror layer, which is arranged between the semiconductor layer stack and the base and reflects electromagnetic radiation emitted by the semiconductor layer stack in the direction of the base. The mirror layer has a plurality of planar reflection sub-surfaces, which are positioned obliquely with respect to a main plane of the radiation-generating region and each form an angle of between 10° and 50° with this plane.

Another aspect of the invention is directed to a semiconductor chip which emits electromagnetic radiation, having an epitaxially produced semiconductor layer stack based on nitride semiconductor material, which includes an n-conducting semiconductor layer, a p-conducting semiconductor layer and an electromagnetic radiation generating region which is arranged between these two semiconductor layers, a base, on which the semiconductor layer stack is arranged, and a mirror layer, which is arranged between the semiconductor layer stack and the base. The n-conducting semiconductor layer faces away from the base, and the n-conducting semiconductor layer or an outcoupling layer located on the n-conducting semiconductor layer has a radiation-outcoupling surface which in turn includes a plurality of planar outcoupling sub-surfaces which are positioned obliquely with respect to a main plane of the radiation-generating region and each form an angle of between 15° and 70° with this plane.

A further aspect of the invention is directed to a method for fabricating a plurality of semiconductor chips which emit electromagnetic radiation. A growth substrate wafer is provided. A semiconductor layer sequence is epitaxially grown on the growth substrate wafer, which includes a p-conducting semiconductor layer, an n-conducting semiconductor layer and an electromagnetic radiation generating region which is arranged between these two semiconductor layers. The n-conducting semiconductor layer is first of all grown on the growth substrate wafer, and a plurality of planar sub-surfaces, which are positioned obliquely with respect to a main plane of the radiation-generating region and each form an angle of between 10° and 50° with this plane, are formed on the p-conducting semiconductor layer surface. A mirror layer is applied to the p-conducting semiconductor layer. A base is applied on or to the mirror layer, and at least part of the growth substrate wafer is removed from the semiconductor layer stack. A contact layer is applied to the n-conducting semiconductor layer, and the wafer produced as just-described is separated into individual semiconductor chips.

Yet another aspect of the invention is directed to a method for fabricating a plurality of semiconductor chips which emit electromagnetic radiation. A growth substrate wafer is provided. A semiconductor layer sequence is epitaxially grown on the growth substrate wafer, which includes a p-conducting semiconductor layer, an n-conducting semiconductor layer and an electromagnetic radiation generating region which is arranged between these two semiconductor layers. The n-conducting semiconductor layer is first of all grown on the growth substrate wafer, and a mirror layer is applied to the surface of the p-conducting semiconductor layer. A base is applied on or to the mirror layer and at least part of the growth substrate wafer is removed from the semiconductor layer stack. The exposed n-conducting semiconductor layer or the remaining part of the growth substrate wafer is etched or mechanically patterned so that a plurality of planar sub-surfaces, which are positioned obliquely with respect to a main plane of the radiation-generating region and each form an angle of between 15° and 70° with this plane, are formed on the n-conducting semiconductor layer surface or on the growth substrate wafer surface. A contact layer is applied to the n-conducting semiconductor layer. Then the just-described wafer is separated into individual semiconductor chips.

According to an embodiment of the invention, a semiconductor chip with an epitaxially produced semiconductor layer stack, in particular based on GaN, has a mirror layer which is applied to the entire surface of a textured p-conducting semiconductor layer. The textured p-conducting semiconductor layer in turn features a plurality of planar sub-surfaces which are positioned obliquely with respect to a main plane of a radiation-generating region and each form an angle of between 10° and 50° with this plane. As a result, the adjacent sub-surfaces form three-dimensional pyramid-like structures. Therefore, a reflection surface provided with pyramid-like structures is formed between the p-conducting semiconductor layer and the mirror layer.

Epitaxial technology as it currently stands allows the deposition of relatively thick n-conducting layers based on GaN. By contrast, the epitaxy used for p-conducting semiconductor material with a good crystal quality based on GaN allows the growth of only relatively thin layers. As the thickness increases, these p-conducting semiconductor layers undergo three-dimensional growth. This three-dimensional growth can be exploited in conjunction with a mirror layer, without great technical effort, to produce the mirror layers described above.

Since the p-conducting semiconductor layer can advantageously be textured during the epitaxy, there is no need in particular for any additional process steps or any additional equipment to effect this texturing. Under deposition conditions aimed at this purpose, the pyramid-like structures can be formed during deposition on the surface of the p-conducting semiconductor layer. This is particularly important in the GaN-based semiconductor material system, since the p-conducting semiconductor layer is very sensitive to processing using plasmas, gases, chemicals or mechanical surface treatment, such as grinding. After a treatment of this nature has been carried out on the p-conducting semiconductor layer, it is no longer possible, or is only possible with great difficulty, to deposit p-contact layers with a low contact resistance. Processes such as plasma etching have a highly adverse effect on the electrical properties of the p-conducting semiconductor layer, on account of the fact that the contact resistance is considerably increased.

In a preferred embodiment, the GaN-based semiconductor layers consist of GaN, AlN, InN, AlGaN, InGaN, InAlN or AlInGaN. These materials allow the generation of radiation in a wide range of the visible region through to the UV spectral region.

In a further preferred embodiment, the mirror layer comprises at least a highly reflective layer, a protective layer and/or a joining layer. This mirror layer may advantageously simultaneously form the electrical contact for the p-conducting semiconductor layer.

Furthermore, it is preferably intended to form a radiation-emitting semiconductor chip of the type described in the introduction, in particular based on GaN, which has a radiation outcoupling surface provided with three-dimensional pyramid-like structures. These pyramid-like structures increase the probability of a beam being decoupled after one total reflection at an opposite sub-surface of the pyramid-like structure. Depending on the angle of the sub-surfaces of the pyramid-like structure, it is possible for a beam which has already been totally reflected once to impinge on another sub-surface and then be decoupled. This makes it possible to increase the probability of light being decoupled and therefore the light yield.

In another preferred embodiment, there is an outcoupling layer on the n-conducting semiconductor layer. An outcoupling layer of this type is preferably patterned for the purpose of making electrical contact and is used to improve the outcoupling of light at the radiation outcoupling surface. This can be achieved by reducing the refractive index gradient at the interface between the semiconductor body and the outcoupling layer as well as the refractive index gradient between the outcoupling layer and the environment. Furthermore, this outcoupling layer can be provided with three-dimensional pyramid-like structures on the surface, in order, as has already been explained above, to reduce the probability of total reflection.

In a further preferred embodiment, the semiconductor layer stack is patterned with a plurality of trenches, so that individual semiconductor layer elements are defined. The trenches penetrate at least as far down as the radiation-generating region of the semiconductor layer stack and allow additional outcoupling of light through the side surfaces of the trenches. These semiconductor layer elements are preferably in the shape of a circle or a hexagon when seen in plan view. These additional lateral outcoupling surfaces can increase the efficiency to over 80%.

In the fabrication method, a semiconductor layer stack is first of all deposited epitaxially on a growth substrate wafer, with an n-conducting semiconductor layer being grown on the growth substrate wafer first, and a plurality of pyramid-like structures being formed on the p-conducting semiconductor layer surface during the epitaxy. In the next step, this textured p-conducting semiconductor layer surface is provided, preferably coated or overlaid over the entire surface, with a mirror layer. In a further step, the growth substrate wafer is at least partly removed from the semiconductor layer stack. Subsequently, the semiconductor layers are electrically contacted and the assembly is then separated into individual chips.

In an advantageous embodiment, the remaining growth substrate wafer which is present on the n-conducting semiconductor layer is patterned in such a way that pyramid-like structures are formed on the substrate surface. This textured surface then serves as the radiation-outcoupling surface.

In a further advantageous embodiment, the growth substrate wafer is completely removed from the semiconductor layer stack, and the n-conducting semiconductor layer surface is patterned in such a way that pyramid-like structures are formed. This textured, n-conducting surface then serves as the radiation outcoupling surface.

In a particularly preferred embodiment, before electrical contact is made, trenches are formed in the semiconductor layer stack, extending at least through the n-conducting semiconductor layer and the electromagnetic radiation generating region and thereby defining individual semiconductor layer elements.

BRIEF DESCRIPTION OF THE DRAWINGS

Further features, advantages and expedient configurations will emerge from the four exemplary embodiments relating to the device and four exemplary embodiments relating to the method which are explained below in conjunction with FIGS. 1 to 8. In the drawings:

FIGS. 1a and 1b each show a diagrammatic sectional view of a first exemplary embodiment of a semiconductor chip according to the invention, FIGS. 2a and 2b each show diagrammatic plan views of a surface which is provided with pyramid-like structures in accordance with the invention.

DETAILED DESCRIPTION OF THE DRAWINGS

Figure 2A:
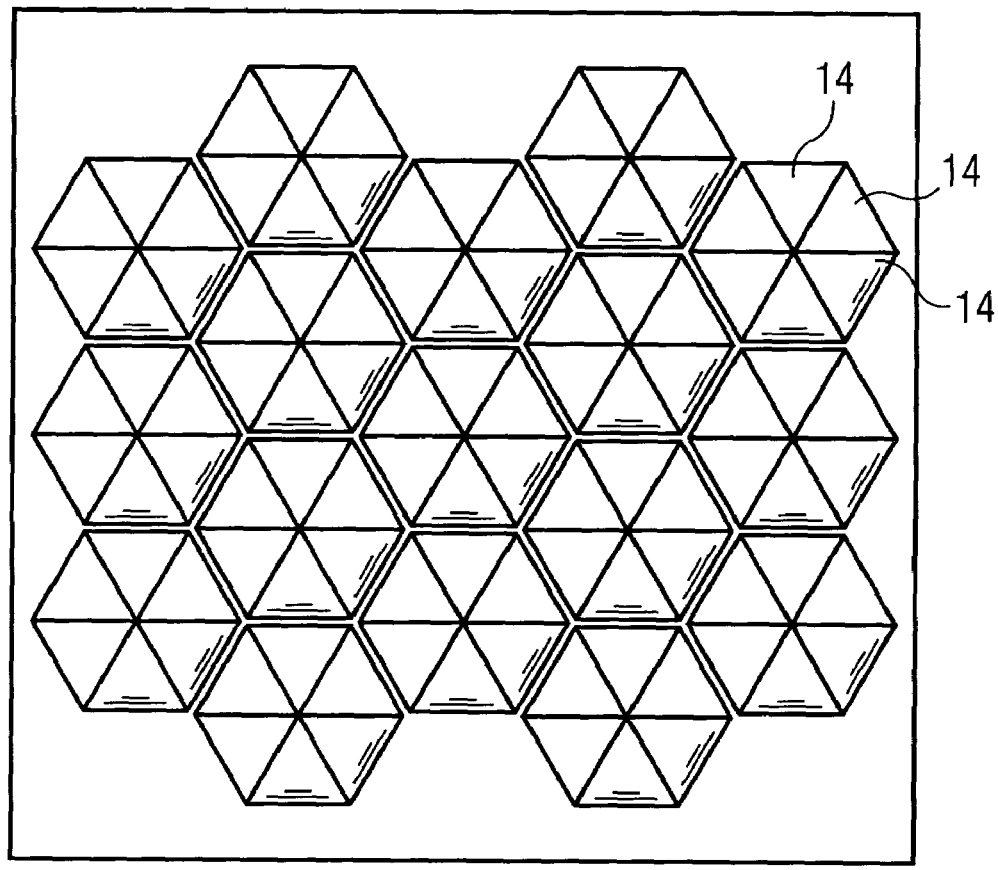

Elements which are identical or have an identical function are provided with identical reference symbols throughout the figures. In particular, the thickness of the layers is not depicted to scale in the figures, in order to make it easier to understand the invention.

The semiconductor chip illustrated in FIG. 1a has a semiconductor layer stack 1 which includes an n-conducting semiconductor layer 11, an active region 12 which generates electromagnetic radiation and a p-conducting semiconductor layer 13. All the layers 11, 12 and 13 consist of nitride III–V compound semiconductor material from the system $In_xAl_yGa_{1-x-y}N$ where $0 \leq x \leq 1$, $0 \leq y \leq 1$ and $x+y \leq 1$. The active region 12 may have a pn junction, a double heterostructure, a single quantum well structure (SQW structure) or a multiple quantum well structure (MQW structure). Structures of this type are known to the person skilled in the art and are therefore not explained in more detail at this point.

The surface of the p-conducting semiconductor layer 13 is provided with pyramid-like structures 15. These pyramid-like structures 15 are overlaid with a mirror layer 40 over the entire surface.

The mirror layer 40 comprises, for example, three layers, namely a highly reflective layer 41, a protective layer 42 and a joining layer 43. The highly reflective layer 41 includes, for example, silver or aluminium and lies directly on the p-conducting semiconductor layer 13. Since silver and aluminium have a good electrical conductivity, the mirror layer 40 can at the same time serve as a contact layer for the p-conducting semiconductor layer 13. The protective layer 42 contains, for example, titanium nitride and lies on the highly reflective layer 41. The joining layer 43 consists, for example, of gold, tin or an alloy of these metals and is arranged between the protective layer 42 and a base 50 (not shown). The patterned surface of the p-conducting semiconductor layer 13 together with the highly reflective layer 41 forms a reflection surface 131. A radiation outcoupling surface 111 is formed by the surface of the n-conducting semiconductor layer 11.

The semiconductor layer stack 1 includes, for example, GaN, and the p-conducting semiconductor layer 13 may be doped with magnesium. The semiconductor layer stack 1 may also comprise other compounds comprising the elements belonging to the third and/or fifth main groups of the periodic system, for example InGaN, InN, AlInGaN, AlGaN and/or AlN. The n-conducting semiconductor layer 13 is, for example, 2 μm thick, and the p-conducting semiconductor layer 0.5 μm thick. The electrical contacting of the semiconductor layer stack is not illustrated in FIG. 1a.

Unless stated otherwise, the above materials and dimensions also apply to the other exemplary embodiments relating to the device and the method.

FIG. 1b shows a beam 3 which is emitted in the direction of the reflection surface 131 and is reflected twice on the reflection surface 131 provided with pyramid-like structures. Specifically, the beam 3 is emitted with an angle (relative to the vertical) from the radiation-generating region 12 and is firstly reflected on a sub-surface 14a and then a second time on a sub-surface 14b which is adjacent to the sub-surface 14a. After this double reflection, the beam 3 can impinge on the radiation outcoupling surface 111 at an angle (relative to the vertical) which is smaller than the angle (with which it is emitted from the radiation-generating region 12.

A crucial factor for this behaviour is the angle (which the sub-surfaces of the pyramid-like structures form with a main plane of the radiation-generating region 12. If the angle (is smaller than the critical angle for total reflection (c, the beam 3 is not totally reflected, but rather is decoupled. If the textured reflection surface 131 acts in such a way that the angle (of a beam, after the beam has been reflected twice, is smaller than the initial angle (with respect to the abovementioned main plane, the beam is decoupled. By contrast, the angle (after reflection on a planar mirror is approximately equal to the angle (, i.e. a flat mirror does not substantially change the angle of a beam.

On the other hand, a greater number of reflections is unfavourable because repeated reflection at the reflection surface and/or at the surface from which light emerges, rapidly causes the intensity of the beam to drop on account of absorption in the chip. Nevertheless, a beam which has already been totally reflected at the radiation outcoupling surface 111 can still have the possibility of being decoupled by double reflection on the textured reflection surface 131, provided that the intensity of the beam is sufficient.

FIG. 2a shows a surface which is provided with a plurality of pyramid-like structures 15. By way of example, each pyramid-like structure 15 comprises six adjacent planar sub-surfaces 14 which are positioned obliquely with respect to a main plane of the radiation-generating region 12. The optimum angle which each sub-surface 14 forms with this main plane depends on whether a reflection surface 131 or a radiation outcoupling surface 111 is concerned.

In the case of a reflection surface 131, each of the sub-surfaces 14 preferably form an angle (of between 10° and 50° with the main plane. This range of angles increases the probability that, after double reflection on the oblique sub-surfaces 14, the angle (will be smaller than the critical angle for total reflection (c. By way of example, the pyramid-like structures 15 each have a base with a width or diameter of 2 (m and a height of 250 nm, corresponding to an angle of approx. 15°.

For a radiation outcoupling surface 111, each of the sub-surfaces 14 preferably form an angle (of between 15° and 70° with the main plane.

Figure 2B:
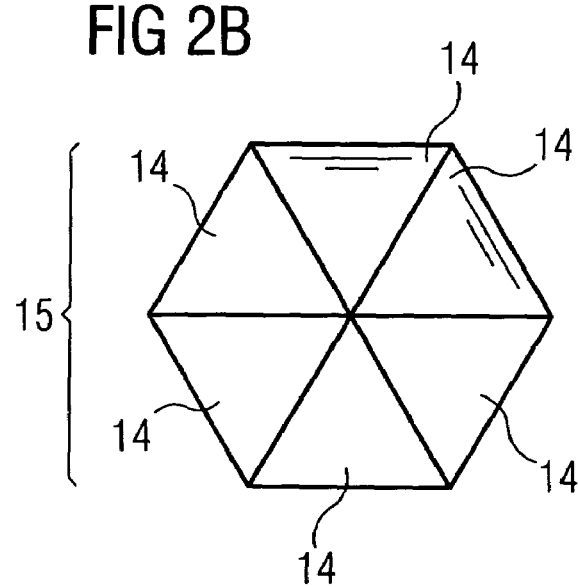

FIG. 2b shows a single pyramid-like structure 15, which consists of six adjacent oblique sub-surfaces 14. Pyramid-like structures which consist of three or more oblique sub-surfaces 14 are also possible. A combination of pyramid-like structures consisting of a different number of sub-surfaces 14, whose sub-surfaces and/or bases are of different sizes, is also possible.

Figure 3:
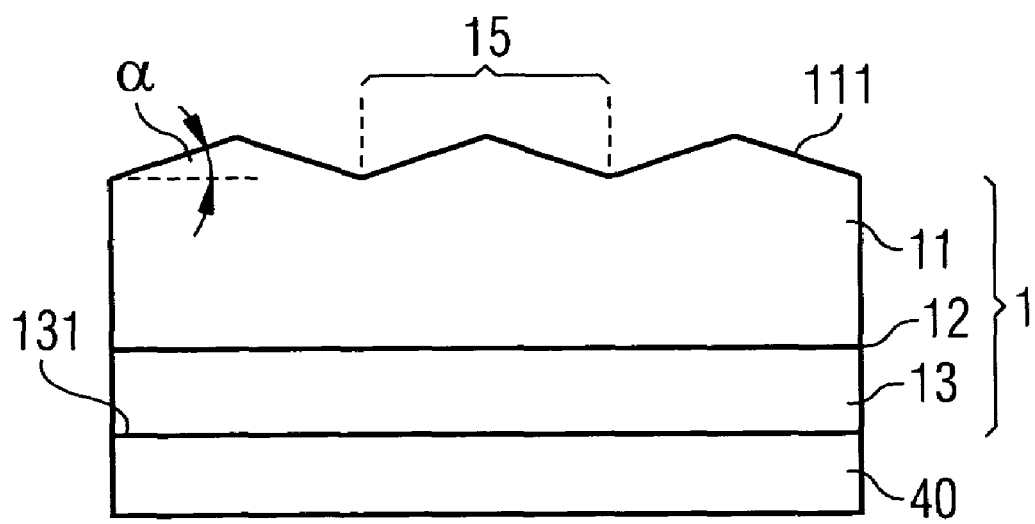
FIG. 3 shows a diagrammatic sectional view of a second exemplary embodiment of a semiconductor chip according to the invention.

FIG. 3 shows a semiconductor chip which has a radiation outcoupling surface 111, which is provided with pyramid-like structures, on the n-conducting GaN-based semiconductor layer 11. The pyramid-like structures have, for example, a pyramid base with a mean diameter of approx. 3 (m and a height of between 100 nm and 2 (m. In the case of a radiation outcoupling surface 111, the sub-surfaces 14 preferably form an angle (of between 15° and 70° with the said main plane.

The fact that the maximum angle (for the radiation outcoupling surface 111 is larger than for the reflection surface 131 is attributable to the fact that a beam which has already been totally reflected can also be decoupled at an opposite sub-surface 14 of the pyramid-like structure 15. The fact that steeper angles are also optimal is advantageous for the radiation outcoupling surface 111, because steeper angles are easier to produce than small angles when patterning by means of masking etch processes. In this case, by way of example, a planar mirror layer 40 is arranged on the p-conducting semiconductor layer 13. The mirror layer 40 is in turn arranged on a base (not shown).

Figure 4:
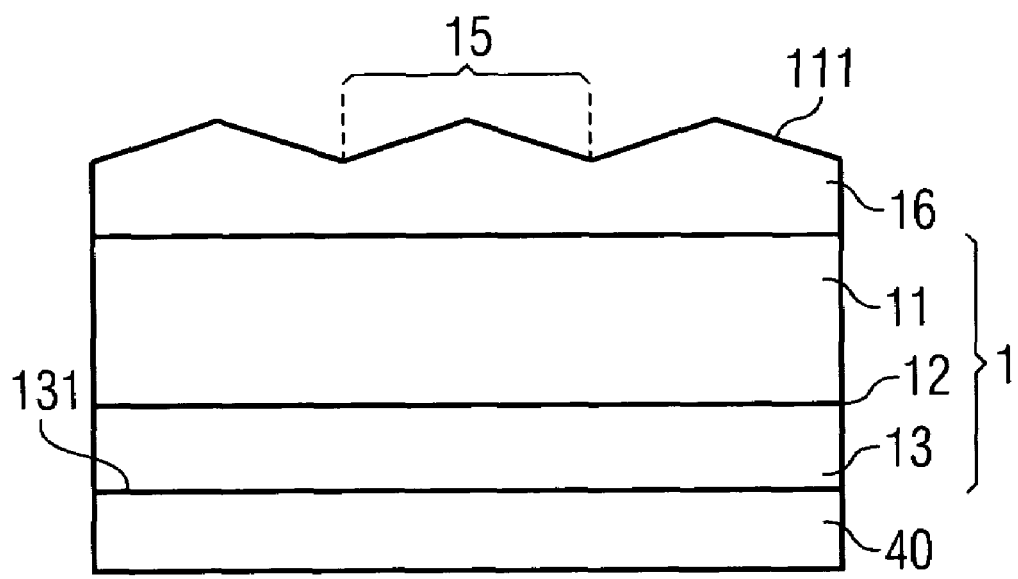
FIG. 4 shows a diagrammatic sectional view of a third exemplary embodiment of a semiconductor chip according to the invention.

FIG. 4 shows a further variant, which has a radiation outcoupling surface 111 provided with pyramid-like structures on an outcoupling layer 16, which in turn is arranged on the n-conducting semiconductor layer 11. The outcoupling layer 16 consists, for example, of SiC and may be an unremoved part of the growth substrate wafer 10. A planar mirror layer 40 is arranged on the p-conducting semiconductor layer 13. This results in a planar reflection surface 131 being produced between the p-conducting semiconductor layer 13 and the mirror layer 40.

Figure 5A:
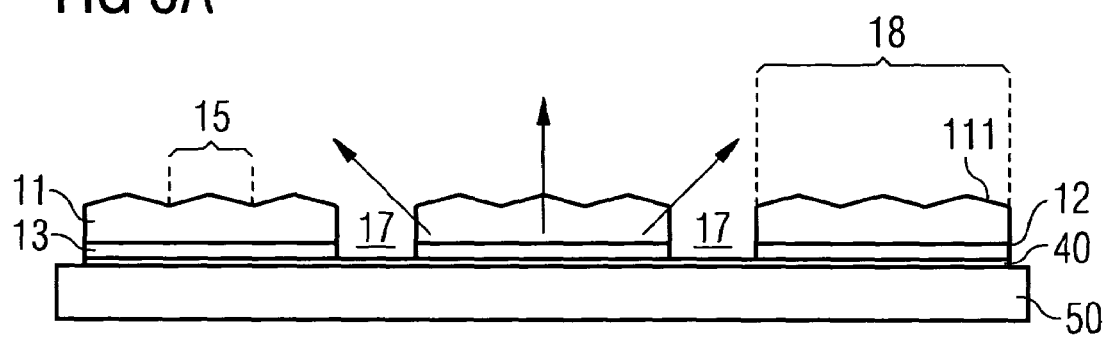
FIGS. 5a and 5b show a diagrammatic sectional view and a diagrammatic plan view, respectively, of a fourth exemplary embodiment of a semiconductor chip according to the invention, FIGS. 6a to 6e diagrammatically depict a first exemplary embodiment of a fabrication method according to the invention, FIGS. 7a and 7b diagrammatically depict a second exemplary embodiment of a fabrication method according to the invention, and FIGS. 8a and b diagrammatically depict a third exemplary embodiment of a fabrication method according to the invention.

Similarly for the semiconductor chip illustrated in FIG. 3, the semiconductor chip shown in FIG. 5a has a plurality of pyramid-like structures on the n-conducting semiconductor layer 11, but additionally also includes at least one trench 17. The trench(es) 17 extend all the way through the n-conducting semiconductor layer 11 and at least as far as the radiation-generating region 12 of the semiconductor stack 1 and are, for example, approx. 2 (m deep and 4 (m wide. The cross section of the trenches is, for example, quadrilateral, although the trench may also take other shapes. The trenches 17 define semiconductor layer elements 18. Each side face, which delimits the trench 17 of the semiconductor stack 1 forms an additional radiation outcoupling surface and thereby increases the outcoupling of light from the semiconductor chip.

The trenches 17 are advantageously sufficiently wide for the radiation to be decoupled directly at the sides without it impinging on an opposite side face of an adjacent semiconductor layer element 18. If the radiation were to impinge on an opposite side face, there would be a risk of it being at least partially absorbed there.

Figure 5B:
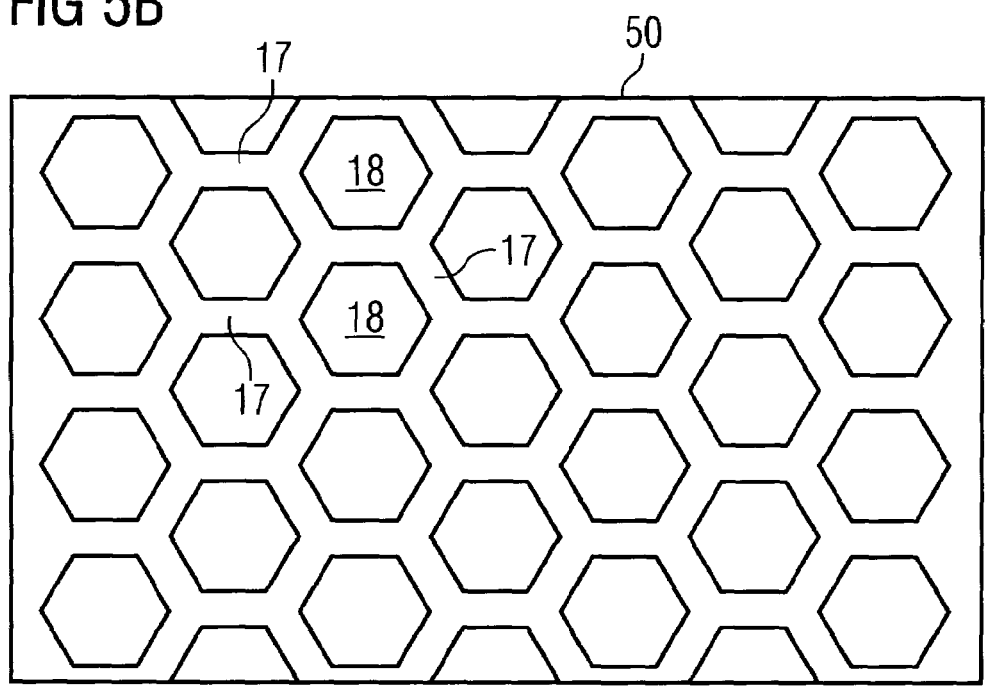

FIG. 5b illustrates a plan view of a semiconductor chip of this type in which the semiconductor layer elements 18 form, for example, hexagonal shapes on a base 50. An individual semiconductor chip of this type includes a plurality of semiconductor layer elements 18. The size of the semiconductor layer elements 18 preferably depends on the size of the pyramid-like structures 15. The semiconductor layer elements 18 illustrated in FIG. 5a each have, by way of example, three pyramid-like structures 15 over their mean diameter. The semiconductor layer elements 18 advantageously have a mean diameter which includes fewer than ten pyramid-like structures. As seen from above, the semiconductor layer elements 18 may also be in the shape of circles or may take other shapes.

Figure 6A:
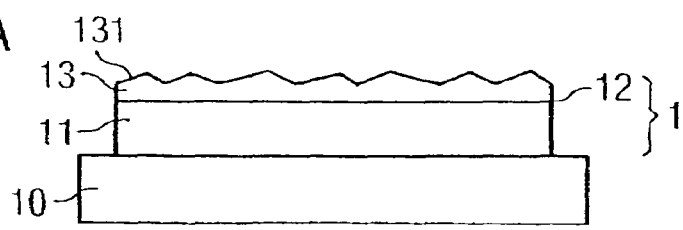

FIGS. 6a to 6e provide an outline illustration of a number of method steps used to fabricate a semiconductor chip illustrated in FIG. 1a. In FIG. 6a, a growth substrate wafer 10, which consists, for example, of SiC, is provided and the n-conducting semiconductor layer 11 is deposited epitaxially on the growth substrate wafer 10. Then, the active region 12 and the p-conducting semiconductor layer 13 are grown epitaxially. The deposition conditions (for example the deposition temperature, deposition time, doping level) are selected in such a way that pyramid-like structures whose sub-surfaces form the desired angles with the main plane, namely between 10° and 50°, are formed on the p-conducting semiconductor layer 13.

Figure 6B:
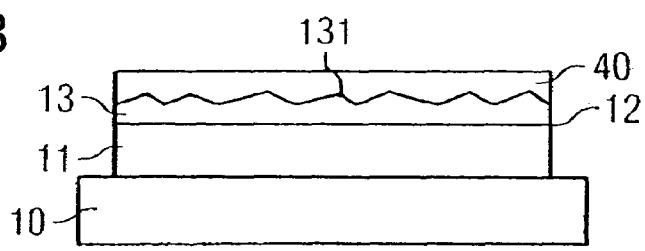
Figure 6C:
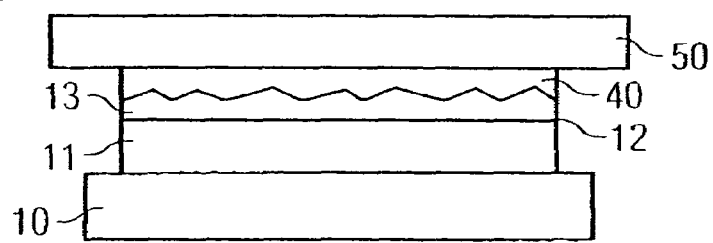

Then, a mirror layer 40 is applied to the entire surface of the textured reflection surface 131 (FIG. 6b). Through the pyramid-like structures which are grown on the p-conducting semiconductor layer 13, a reflection surface 131 is formed between the p-conducting semiconductor layer 13 and the mirror layer 40. A base 50 is adhesively bonded or soldered to the surface of the mirror layer 40 which lies on the opposite side from the reflection surface 131. The mirror layer 40 includes, for example, a joining layer, through which the base 50 can be adhesively bonded or soldered to the semiconductor layer stack 1 (FIG. 6c). The base 50 consists, for example, of gallium arsenide or copper.

Figure 6D:
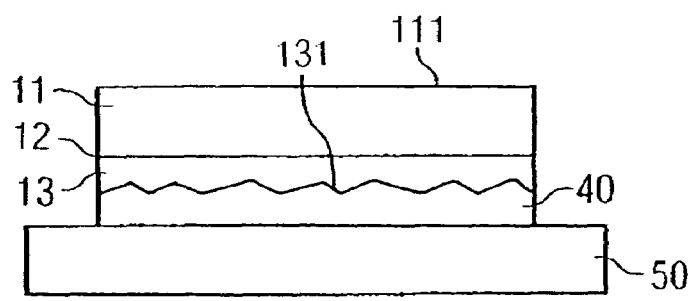
Figure 6E:
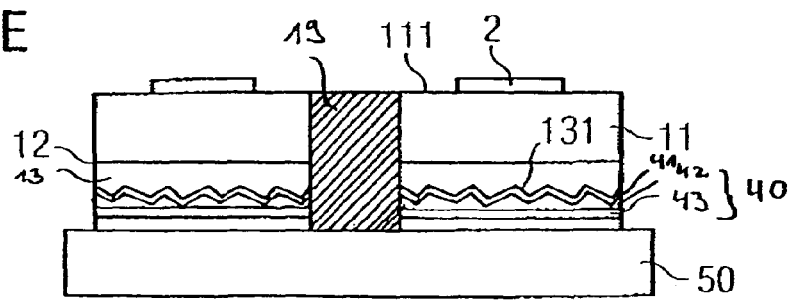

The growth substrate wafer 10 is removed from the semiconductor layer stack 1, for example by means of a laser lift-off method, a sacrificial layer, a layer provided with predetermined breaking points or any other method which is known to the person skilled in the art (cf. FIG. 6d). The n-conducting semiconductor layer 11 is then provided with a contact layer 2 which includes, for example, indium tin oxide (ITO) or ZnO. The p-conducting semiconductor layer 13 is already electrically contacted by means of the electrically conductive mirror layer 40. The chips are then separated, for example, by sawing (cf. FIG. 6e).

Figure 7A:
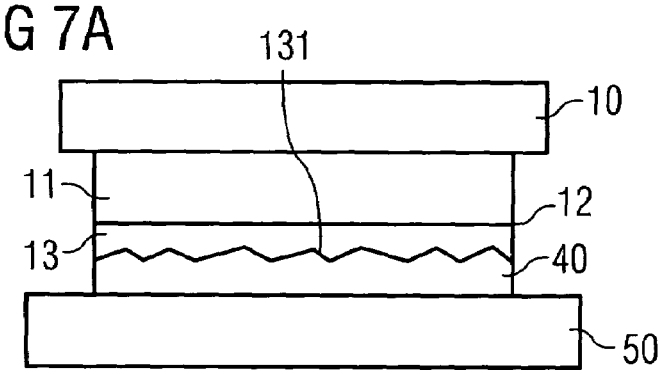
Figure 7B:
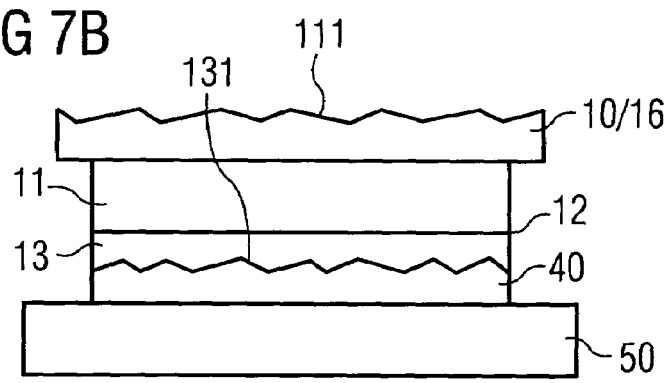
Figure 8A:
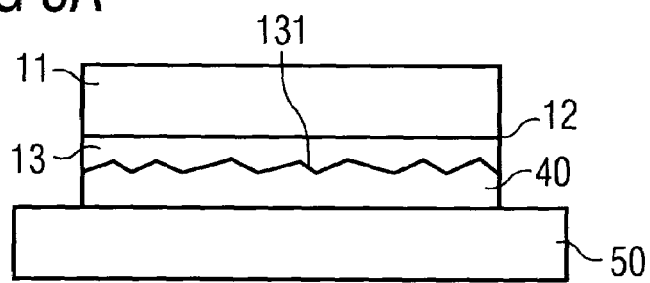
Figure 8B:
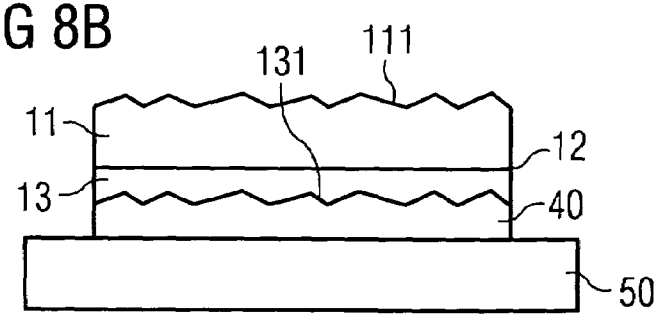

In a variant of the fabrication method illustrated in FIG. 6, the growth substrate wafer illustrated in FIG. 6c is not completely removed (cf. FIG. 7a). The remaining part of the growth substrate wafer 10 is then patterned with pyramid-like structures (cf. FIG. 7b). The patterning can be carried out by means of a chemical process (e.g. an etching process) or a mechanical process (e.g. grinding, sawing or milling). This results in a textured radiation outcoupling surface 111 which consists, for example, of SiC. This textured layer formed from part of the growth substrate wafer 10 corresponds to the layer referred to as the outcoupling layer 16 in FIG. 4. This outcoupling layer 16 is then suitably patterned in order for electrical contact to be made with the n-conducting semiconductor layer 11. On account of the electrically conductive mirror layer 40, electrical contact of the p-conducting semiconductor layer 13 has already been established on the surface. The chips are then separated.

In a further variant of the fabrication method illustrated in FIG. 6, the n-conducting semiconductor layer 11 is textured with pyramid-like structures after the growth substrate wafer 10 has been completely removed. This textured surface serves as the radiation outcoupling surface 111 and can be produced by means of mechanical or chemical processes. The way in which electrical contact of the n-conducting semiconductor layer 11 is established and the chips are separated corresponds to that which has already been described above.

Furthermore, before contact is made with the n-conducting semiconductor layer 11, trenches 17 can be produced in the semiconductor layer stack 1, for example in order to fabricate the semiconductor chip illustrated in FIG. 5a. These trenches can be produced, for example, by means of an etching process combined with photolithography. First of all, a mask layer is applied to the n-conducting semiconductor layer 11 or the outcoupling layer 16 and is suitably patterned in order to define the desired shape and arrangement of semiconductor layer elements 18. Those parts of the semiconductor layer stack 1 or of the outcoupling layer 16 which are not covered by the mask layer are etched until the trenches 17 formed by etching, in terms of their depth, at least reach the radiation-generating region 12. By way of example, the trenches in the exemplary embodiment illustrated in FIG. 5a have been etched all the way to the mirror layer 40. After the mask layer has been removed, contact can be made with the chips and the chips can be separated.

The above-described variants of the fabrication method illustrated in FIG. 6 can also take place without the patterning of the p-conducting semiconductor layer 13, so that in such cases a planar mirror layer is provided.

The present patent application claims the priority of German patent application 102 45 628.3-33, the disclosed content of which is hereby incorporated by reference.

The scope of protection of the invention is not limited by the description of the invention on the basis of the exemplary embodiments. Rather, the invention comprises any novel feature and any combination of features, which in particular includes any combination of features which are stated in the patent claims, even if this combination of features is not explicitly stated in the paten claims.

We claim:

1. A semiconductor chip which emits electromagnetic radiation, comprising:
   an epitaxially produced semiconductor layer stack based on a nitride semiconductor material, which includes an n-conducting semiconductor layers, a p-conducting semiconductor layer and an electromagnetic radiation generating region which is arranged between said n-conducting and p-conducting semiconductor layers;
   a base, on which the semiconductor layer stack is arranged; and
   a mirror layer, which is arranged between the semiconductor layer stack and the base and reflects electromagnetic radiation emitted by the semiconductor layer stack in a direction of the base,
   wherein the mirror layer has a plurality of planar reflection sub-surfaces, which are positioned obliquely with respect to a main plane of the electromagnetic radiation-generating region and each form an angle of between 10° and 50° with respect to the main plane, and
   wherein the p-conducting semiconductor layer faces the base, and the mirror layer is comprised of a reflection surface of the p-conducting semiconductor layer, which includes the plurality of planar sub-surfaces which are positioned obliquely with respect to the main plane of the electromagnetic radiation-generating region and each form the angle of between 10° and 50° with respect to the main plane.

2. The semiconductor chip which emits electromagnetic radiation according to claim 1, wherein the reflection sub-surfaces form pyramid-like structures.

3. The semiconductor chip which emits electromagnetic radiation according to claim 1, wherein the mirror layer includes a plurality of different layers.

4. The semiconductor chip which emits electromagnetic radiation according to claim 1, wherein the mirror layer comprises a highly reflective layer, and at least one of a protective layer, and a joining layer.

5. The semiconductor chip which emits electromagnetic radiation according to claim 4, wherein the highly reflective layer contains silver or aluminum.

6. The semiconductor chip which emits electromagnetic radiation according to claim 4, wherein the protective layer contains titanium nitride.

7. The semiconductor chip which emits electromagnetic radiation according to claim 4, wherein the joining layer contains at least one of gold, tin and an alloy of these metals.

8. The semiconductor chip which emits electromagnetic radiation according to claim 1, wherein the semiconductor layer stack includes at least one trench which defines a plurality of individual semiconductor layer elements.

9. The semiconductor chip which emits electromagnetic radiation according to claim 8, comprising a plurality of trenches extending such that the semiconductor layer elements, in plan view, are in the shape of one of a circle, a hexagon, a quadrilateral, a triangle or a combination of these shapes.

10. The semiconductor chip which emits electromagnetic radiation according to claim 8, wherein the semiconductor layer elements each have a diameter or a width which includes at most ten pyramid-like structures.

11. The semiconductor chip which emits electromagnetic radiation according to claim 8, wherein the at least one trench is at least sufficiently deep so as to at least isolate the radiation-generating region.

12. The semiconductor chip which emits electromagnetic radiation according to claim 8, wherein a width of the at least one trench is at least double a depth of the at least one trench.

13. The semiconductor chip which emits electromagnetic radiation according to claim 8, wherein the at least one trench is filled with an electrically insulating material which transmits radiation generated by the radiation-generating region.

14. The semiconductor chip which emits electromagnetic radiation according to claim 1, comprising a radiation-transmitting electrically conductive contact layer arranged on the n-conducting semiconductor layer.

15. The semiconductor chip which emits electromagnetic radiation according to claim 14, wherein the contact layer contains at least one of indium tin oxide and ZnO.

16. The semiconductor chip which emits electromagnetic radiation according to claim 1, wherein the semiconductor chip does not contain a growth substrate.

17. The semiconductor chip which emits electromagnetic radiation according to claim 1, wherein the p-conducting semiconductor layer is doped with magnesium.

18. The semiconductor chip which emits electromagnetic radiation according to claim 1, wherein the base contains gallium arsenide or copper.

* * * * *